United States Patent [19]

Peiffer

[11] 4,157,407

[45] Jun. 5, 1979

[54] TONING AND SOLVENT WASHOUT PROCESS FOR MAKING CONDUCTIVE INTERCONNECTIONS

[75] Inventor: Robert W. Peiffer, Jackson, N.J.

[73] Assignee: E. I. Du Pont de Nemours and Company, Wilmington, Del.

[21] Appl. No.: 877,465

[22] Filed: Feb. 13, 1978

[51] Int. Cl.² .............................................. B05D 3/06
[52] U.S. Cl. ....................................... 427/54; 29/625;
96/36.2; 156/253; 156/272; 156/285; 156/649;
427/97; 427/98; 427/301; 427/307; 428/901
[58] Field of Search ...................... 427/54, 97, 98, 301,
427/307; 156/253, 272, 285, 649; 96/36.2;
428/901; 29/625

[56] References Cited

U.S. PATENT DOCUMENTS

| | | | |
|---|---|---|---|
| 3,615,471 | 10/1971 | Lenoble et al. | 96/36.2 X |
| 3,778,900 | 12/1973 | Haining et al. | 96/36.2 X |
| 3,934,334 | 1/1976 | Hanni | 427/97 X |
| 3,934,335 | 1/1976 | Nelson | 96/36.2 X |
| 4,023,999 | 5/1977 | Linberg et al. | 427/97 X |
| 4,052,787 | 10/1977 | Shaheen et al. | 427/98 X |
| 4,054,479 | 10/1977 | Peiffer | 156/280 |
| 4,054,483 | 10/1977 | Peiffer | 156/632 |

*Primary Examiner*—Ronald H. Smith
*Assistant Examiner*—Thurman K. Page

[57] ABSTRACT

By the process of this invention, two layer printed circuits having conductive interconnections are prepared by applying a photoadhesive layer to a substrate bearing an electrically conductive circuit pattern, exposing the photoadhesive layer to a circuit image related to the circuit pattern to produce adherent circuit image areas having segments thereof, e.g., pad areas, overlying segments of the electrically conductive circuit pattern, applying metal, alloy or plating catalyst powder, e.g., copper, to the adherent image areas, exposing the metallized or catalytic circuit pattern to an image of the overlying segments of the previous circuit patterns, removing the overlying segment areas of the photoadhesive layer with a suitable solvent, and treating the metallized surface by plating, e.g., electrolessly plating, or by soldering. Multilayer printed circuits can also be prepared by repeating these steps with additional layers of photoadhesive material adhered to underlying printed circuits.

14 Claims, No Drawings

TONING AND SOLVENT WASHOUT PROCESS FOR MAKING CONDUCTIVE INTERCONNECTIONS

DESCRIPTION

1. Technical Field

This invention relates to a new method for preparing printed circuit boards, particularly multilayer printed circuit boards. More particularly this invention relates to the preparation of multilayer printed circuit boards with plated-through-holes and inter-layer connections using photosensitive elements in an additive plating process.

2. Background Art

In preparing printed circuit boards conductive holes are introduced through the boards to accomodate insertion and soldering of electrical component leads and for making electrical connections between two or more circuit patterns. Conductive holes are conventionally introduced by drilling or punching holes through a copper clad, rigid board followed by a plating procedure. The holes are usually plated by a copper reduction procedure such as that disclosed in "Printed Circuits Handbook" edited by Clyde F. Coombs, Jr., published by McGraw-Hill Book Company, New York, New York, 1967, Chapter 5, and in "Printed Circuits and Electronics Assemblies" edited by C. R. Draper, published by Robert Draper Ltd., Teddington, 1969, Chapter 6. The copper clad board with plated-through-holes can then be processed into printed circuit boards using resists and processes as disclosed in the aforementioned "Printed Circuits Handbook" or, for example, in any one of U.S. Pat. Nos. 3,469,982; 3,526,504; 3,547,730; 3,622,334 and 3,837,860. A disadvantage of the conventional copper reduction procedure for plating holes is the waste of expensive catalyst which adheres to the copper cladding as well as the holes, resulting in superfluous overplating of the copper cladding.

Printed circuits can also be prepared by depositing copper conductor patterns directly on insulating substrates by processes such as those disclosed in the following U.S. Pat. Nos. 3,060,024; 3,146,125; 3,259,559; 3,391,455; 3,506,482; 3,562,038; 3,628,999; 3,791,858; 4,054,479 and 4,054,483. The preparation of multiplayered printed circuit boards using a photohardenable film and the additive plating process is described in the latter two U.S. patents. However, conductive interconnections between layers are produced by predrilling holes and registering the holes with the printed circuit patterns. Such predrilling procedures are limited by the inherent inaccuracies of registration to printed circuit patterns where circuit lines are not closely spaced.

It is therefore desirable to avoid the above problems by preparing printed circuits with electrical interconnections without drilling or punching the requisite hole and without using the time consuming hole chemical catalyzation process of the prior art. By the process of the invention multilayered circuits can be provided having higher packing density with multiple crossovers and interconnections.

DISCLOSURE OF INVENTION

In accordance with this invention there is provided a process for preparing a two layer printed circuit board having conductive interconnections which comprises:

(a) applying to a substrate bearing an electrically conductive circuit pattern a layer of photoadhesive composition;

(b) exposing the layer to actinic radiation through a circuit image which is related to the underlying circuit pattern leaving an adherent circuit image having at least one segment thereof overlying at least one segment of the conductive circuit pattern;

(c) applying finely divided metal, alloy or plating catalyst material to the adherent image areas;

(d) exposing the metallized or catalyzed image to actinic radiation through an image of at least one overlying segment of the previous circuit patterns;

(e) removing each overlying segment area with a solvent for the photoadhesive composition; and (f) plating, or soldering, the metallized or catalyzed image.

The overlying segments of the adherent circuit image may simply be a portion of a circuit line, e.g., a line cross over point, or it may be a specific pad area, e.g., a circular pad designated for insertion of plated through holes and/or plated post interconnections. Similarly, the segment or segments of the underlying conductive circuit pattern which are in register or in common with the adherent circuit segment and are to form part of the plated post interconnection may be a portion of the conductive circuit line, a specific pad area, or may be a plated or unplated through-hole. In the instance where the conductive circuit segment is a through-hole, the through-hole, if plated, may be maintained by the process of this invention through numerous added circuit layers and if unplated, a plated through-hole can be formed through the circuit layers. It should also be recognized that one overlying segment may be used to interconnect one or more underlying segments and vice versa.

The printed circuit substrate employed in the present invention can be any one of the various kinds of sheets, plates, synthetic resin plates, synthetic resin laminated plates, or composites, etc., having the necessary electrical and mechanical properties, chemical resistance, heat resistance, etc. Examples of resins include: phenol-formaldehyde, epoxy and melamine resins, etc. Glass plates and ceramic or ceramic coated metal plates are also useful. The substrate can also be a paper, cardboard, fiber, including glass cloth, wooden sheet material or paper base phenolic resin laminate. Paper base without resin is particularly useful in producing low-cost printed circuits. Metal sheets can be used provided that the material adhered thereto acts as an insulating barrier between the metal sheet support and the builtup metallized circuit. Also useful are self-supported photohardenable elements as disclosed in U.S. Pat. No. 4,054,479. A printed circuit which can contain closely spaced lines is present thereon. The printed circuit can be prepared by standard methods known in the art, e.g., etching of copper on the surface of the substrate or by other methods such as those described in Assignee's U.S. application Ser. No. 874,352, filed Feb. 1, 1978 and U.S. application Ser. No. 874,353, filed Feb. 1, 1978.

To form printed circuit boards with conductive interconnections according to the invention a layer of an adherent, e.g., tacky, photoadhesive composition is applied to the printed circuit surface. The photoadhesive composition can be applied in liquid form, e.g., solution, suspension, etc., by conventional means, e.g., dip coating, spin coating, coating with a doctor knife, spraying, etc. Preferably, however, the photoadhesive composition is applied in the form of a dry layer using a lamination procedure. The photoadhesive layer may be at least 0.00005 inch (0.0013 mm) in thickness and in the preferred form the layer may range in thickness from about 0.0003 inch (0.008 mm) to about 0.01 inch (~0.25 mm) and has adhered thereto with low to moderate adherence a thin, flexible, polymeric film support which transmits radiation actinic to the photoadhesive layer. The opposite side of the photoadhesive layer can have adhered thereto a protective cover sheet with less adherence to the layer than adherence between the support and the layer.

For the purposes of this invention a photoadhesive composition is a photosensitive composition which upon imagewise exposure to actinic light will form adherent image areas in either exposed or unexposed image areas either directly or after subsequent treatment of the composition. Photoadhesive layers include photohardenable layers such as photopolymerizable layers capable of addition polymerization which are preferred as well as photocrosslinkable layers, and photodimerizable layers. Preferably, the adherent compositions should be tacky enough to adhere the finely divided metal or catalytic material but not too tacky whereby the particles would become engulfed or heavily coated with adherent material. Photohardenable layers are disclosed in the following U.S. patents which are incorporated by reference: U.S. Pat. Nos. 3,469,982; 3,526,504; 3,547,730; 3,060,024; 3,622,334; 3,649,268 and French Pat. No. 72 11658. Photopolymerizable layers and elements are more fully described in U.S. Pat. No. 4,054,483, the disclosure of which is incorporated by reference. Photopolymerizable compositions generally contain at least one binder, ethylenically unsaturated monomers, initiators or initiator system, thermal polymerization inhibitors and other additives such as dyes, pigments, plasticizers, etc.

The lamination procedure, referred to above, can be suitable method known in the art, e.g., one described in U.S. Pat. Nos. 3,469,982; 3,629,036; 3,984,244; and Belgian Pat. No. 834,269.

In a preferred process wherein a printed circuit board having conductive interconnections is prepared using a supported adherent photopolymerizable element and a substrate bearing an electrically conductive printed circuit pattern having pad segments, the process comprises, in order:

(a) laminating to a substrate bearing an electrically conductive circuit pattern having pad segments the photopolymerizable layer;

(b) exposing the photopolymerizable layer to actinic radiation through a circuit image which is related to the underlying circuit pattern leaving an adherent circuit pattern on the photopolymerizable surface, said adherent pattern having at least one pad segment thereof overlying at least one pad segment of the conductive printed circuit pattern;

(c) removing the support from the photopolymerizable layer;

(d) applying finely divided copper particles, e.g., 1.0 to 250 microns in average diameter, to the adherent circuit pattern;

(e) exposing the particulate copper circuit pattern to actinic radiation through an image of at least one overlying pad segment of the previous circuit pattern and which is opaque to actinic radiation in the areas corresponding to any overlying pad segment area to be interconnected;

(f) removing the unexposed areas of the photopolymerizable layer with a solvent for the photopolymerizable layer; and (g) plating electrolessly the particulate copper circuit pattern to form an electrically conductive circuit pattern interconnected with the underlying electrically conductive printed circuit pattern. Optionally, between steps (f) and (g), the developed printed circuit board can be heated or baked to a temperature up to about 180° C., e.g., for a period of about 10 seconds to 60 minutes. The heating improves the adhesion of the finely divided metallic or plating catalyst material, e.g., copper powder, to the adherent image surface during electroless plating. As different photohardenable compositions are used the heating temperature may vary; but, in all cases, the temperature is below the degradation temperature of the photohardenable composition.

In an equally preferred process, the copper powder image can be directly soldered as disclosed in Assignee's U.S. application Ser. No. 874,352, entitled "Producing Printed Circuits By Soldering Metal Powder Images", filed Feb. 1, 1978. Thus in the aforesaid process between steps (d) and (e) the element is preferably heated briefly as described above to improve the adhesion of the copper particles, and step (g) is replaced by plating the copper circuit pattern by treating the pattern with flux and directly soldering the copper pattern. Other finely divided materials can be used which are solder wettable.

Once a photohardenable composition or layer is applied to the circuit board surface, it is exposed imagewise to a source of actinic radiation through an image which is related to the underlying circuit pattern to form a tacky image which has at least one area or segment which overlies or is in register with at least a segment of the circuit pattern. Suitable radiation sources depend on the photohardenable composition type. Generally, the radiation sources are rich in ultraviolet radiation. Radiation sources disclosed in U.S. Pat. Nos. 2,760,863 and 3,649,268 are useful. The exposure is through a phototool which is related to the underlying circuit pattern.

Metal and alloy particles and plating catalyst particles are applied to the tacky and nontacky image areas. Suitable particles that can be subsequently electrolessly plated, or soldered as known in the art include: copper, tin, lead, solder, mixtures of copper and solder, copper-tin alloy, tin-lead alloy, aluminum, gold, silver; metal oxides such as titanous oxide, copper oxide, etc. Also useful are metal coated particles, e.g., silver coated glass. The particles have an average diameter of 1.0 to 250 microns, preferably 5 to 25 microns, in average diameter. Copper powder is preferred.

The particles can be applied by known methods including, but not limited to, the toning methods described in U.S. Pat. Nos. 3,060,024; 3,391,455; 3,506,483; 3,637,385 and 3,649,268. It is also possible to apply the particles by use of a fluidized bed of particles as described in *Research Disclosure,* June 1977, No. 15882 by Peiffer and Woodruff. It is important that the excess metal, or plating catalyst particles be removed from the non-adherent image areas. Suitable mechanical and other means for accomplishing this are described in the above-identified U.S. patents and the *Research Disclosure.*

After the metal, alloy or plating catalyst particles have been applied to the tacky or adherent image areas and the non-tacky or non-adherent image areas cleaned of any particles, if necessary, the metallized or catalyzed image is exposed in register to actinic radiation through a phototool which is opaque to the exposing radiation in the areas corresponding to the pad areas of the underlying circuit pattern. The unexposed areas remaining on the photoadhesive layer are removed with a suitable solvent by procedures known to those skilled in the art. The particular solvent is dependent on the photoadhesive composition. In some instances after development metal or catalytic particles may be reapplied to the developed areas.

The metallized or catalyzed image is electrolessly plated or soldered to form the electrically conductive circuit pattern interconnected with the underlying electrically conductive printed circuit pattern. The metallized image, when metal particles are reapplied after development as described above, may be electrolessly plated or soldered or conjoined as described in Assignee's U.S. application Ser. No. 874,353, filed Feb. 1, 1978. The final printed circuit board has conductive interconnections and can have high packing density with multiple crossovers, if desired.

Additional conductive printed circuits may be added to the two layer printed circuit element to form a multilayer circuit board by successively repeating steps (a) through (g), described above, using the printed circuit board formed for the succeeding step (a). Thus, high density printed circuit elements can be formed with three or more related conductive printed circuits which can be joined in a three dimensional network by conductive interconnections.

A multilayer printed circuit board can also be prepared by the use of a two sided printed circuit board with plated-through-holes, that is, a substrate bearing on each side a conductive printed circuit pattern connected by conventional plated-through-holes. In this embodiment, one or both sides of the two sided printed circuit board are used as the substrate bearing a circuit pattern in step (a) of the described process of this invention and the succeeding steps are carried out appropriately on each side. In this embodiment, as well as any embodiment where plated-through-holes are present in the substrate, the process of this invention may be used to either shield or "tent" the plated-through-holes or it may be used to maintain the plated-through-holes and connect any of the successive printed circuit patterns formed. Thus, plated-through-holes may be maintained as circuit interconnections only or they may also be used for insertion of electrical components.

BEST MODE FOR CARRYING OUT THE INVENTION

The best mode is illustrated in Example 1 wherein a clean, etched copper circuit is laminated with a photopolymerizable element as described therein and is exposed through a photographic positive image which is related to the underlying etched circuit pattern by having common pad segments in register. After removal of the support from the photopolymerized surface, the tacky surface is dusted with copper powder, 8 to 11 microns in average diameter. The excess copper is removed from the non-tacky areas, and the element is exposed through an image which is opaque to the exposure radiation in the areas corresponding to the pad areas. Upon development the pad areas are removed, the element is baked by heating and then is electrolessly plated to form an electrically conductive printed circuit.

INDUSTRIAL APPLICABILITY

The process enables two or more layered printed circuits with electrical interconnections to be prepared without drilling or punching the requisite hole and without chemical catalyzation of the through holes which is time consuming. Higher packing density in multilayer printed circuits is achieved by permitting multiple crossovers and interconnections to be made in the same zone. The interconnections are made with the ease and accuracy associated with a photographic process. All or part of the surface conductors can be made flush with the surface of the resultant printed circuit board.

EXAMPLES

The invention is illustrated by the following examples wherein the parts are by weight.

EXAMPLE 1

Four 7.62 by 12.70 cm single-sided copper-clad panels on which the copper is etched to produce a circuit pattern are cleaned with a circuit board cleaning machine having a rapidly revolving silicon carbide brush. The copper oxide is thereby removed from the surface of the copper-clad printed circuit. A polyethylene terephthalate (0.025 mm thick) supported tacky photopolymerizable layer, 0.0011 inch (~0.028 mm) thick, having the following composition:

Copolymer of methyl methacrylate and ethyl acrylate (95.5/4.5)—10.0 g.
Solid unsaturated urethane polymer—20.0 g.
4,4'-bis(dimethyl amino)-benzophenone—0.5 g.
2-o-chlorophenyl-4,5-diphenyl-imidazolyl dimer—2.0 g.
Trimethylol propane triacrylate—10.0 g.
Triethylene glycol dimethacrylate—7.5 g.

is laminated to each of the four copper surfaces by means of heated pressure rollers at 110°-120° C.

The resultant four laminated photopolymerizable elements are each imagewise exposed in register through a photographic positive image which is related to the underlying etched copper circuit pattern for 45 seconds to ultraviolet radiation from a 400 watt, medium pressure, mercury vapor lamp on a Model DMVL-HP Double Sided Exposure Frame, a product of Colight, Inc., Minneapolis, Minn.

The polyethylene terephthalate supports are removed, and the four elements are dusted with finely divided copper powder, Alcan® MD-301 having an average particle size of about 8 microns, manufactured by Alcan Metal Powders division of Alcan Aluminum Corp., Elizabeth, New Jersey. The excess copper is removed with a fine water spray leaving a circuit pattern defined by copper powder adhering to the unexposed areas of the photopolymerizable layer.

Each element is exposed in register for 4 minutes using the above DMVL-HP exposure source through a photographic positive image which is opaque to the exposure radiation only in those areas corresponding to the circular pad areas common to the two circuit patterns. The element samples are then developed in methyl chloroform for 60 seconds using a Riston® Model C Processor manufactured by E. I. du Pont de Nemours and Company, Inc., Wilmington, Delaware to remove the copper powder and photopolymerizable composition only in the areas which are not exposed to the actinic radiation. The pad areas are cleanly removed by the developing solvent allowing the underlying etched copper surface of the original printed circuit to be clearly visible through the holes produced on all four elements.

The elements are baked for 1 hour at 160°–165° C. and then plated for about 17 hours in an electroless copper plating bath, HiD-410, manufactured by Photocircuits Division of Kollmorgen Corp., Glen Cove, Long Island, New York. After a water rinse and air drying, the elements are examined. Good electrical conductivity is observed between the two parallel circuits via the plated post interconnections.

EXAMPLE 2

A multilayered printed circuit is prepared from a two sided printed circuit board having a related copper printed circuit on each side connected by plated-through-holes. The two sided printed circuit board with plated through holes is dip coated in a methylene chloride solution of the photopolymerizable composition of Example 1. To each side of the dried coated circuit board is laminated a polyethylene terephthalate film, 0.025 mm in thickness. As described in Example 1, each side of the resultant element is imagewise exposed in register to a photographic positive image which is related to the underlying copper circuit pattern and through holes, the polyethylene supports are removed, and the surfaces are dusted with copper powder, excess powder being removed to leave related circuit patterns of copper powder.

Each side of the formed element is exposed for 4 minutes using the exposure source described in Example 1 through a photographic positive image which is opaque to the exposure radiation only in those areas corresponding to the plated through holes. The element is then developed in methyl chloroform, baked, and electrolessly plated as described in Example 1 to give a four layered printed circuit pattern wherein good electrical conductivity is observed between each of the parallel circuits.

EXAMPLE 3

A single sided three layered printed circuit board is prepared by laminating an additional photopolymerizable layer described in Example 1 to the surface of the electrolessly plated circuit of the two layer element of Example 1. The exposing, dusting, developing, baking and electroless plating steps are repeated as described in Example 1 to give a printed circuit with good conductivity between each parallel circuit layer.

EXAMPLE 4

A polyethylene terephthalate film supported photopolymerizable layer, 0.003 inch (∼0.08 mm) in thickness, of the following composition:

|  | Parts |
| --- | --- |
| Pentaerythritol triacrylate | 25.0 |
| Di-(2-acryloxyethyl) ether of tetrabromo Bisphenol-A | 10.0 |
| Di-(3-acryloxy-2-hydroxypropyl) ether of Bisphenol-A | 15.0 |
| Methyl methacrylate(46)/acrylonitrile(9)/butadiene(14)/styrene(31) copolymer | 30.0 |
| Methyl methacrylate(95)/ethyl methacrylate(5) copolymer | 8.0 |
| Michler's ketone | 0.4 |
| Benzophenone | 5.3 |
| Antimony oxide ($Sb_2O_3$) | 6.0 |
| Monastral Green pigment | 0.3 | is laminated at 115° C. to a 0.062 inch (1.57 mm) thick paper base phenolic resin laminate, the surface of which is roughened. Lamination is accomplished in a vacuum laminator, Riston ® A-1 Vacuum Laminator manufactured by E. I. du Pont de Nemours and Company, Inc., Wilmington, Delaware. The photopolymerizable layer is exposed for 20 seconds through a photographic positive pattern to ultraviolet radiation from the DMVL-HP exposure source described in Example 1. The polyethylene terephthalate support is removed, and copper powder as described in Example 1, is applied to the exposed surface in a fluidized bed. After the excess copper powder is removed by shaking, the metallized board is heated for 50 seconds at 160° C. The metallized board is passed once through an ultraviolet exposure source at 10 ft./minute (3.05 m/minute), Model PC-7100 UV Processor, manufactured by Argus International, Hopewell, New Jersey to harden the photopolymer matrix. The circuit pattern defined by the adherent copper powder is brushed with an aqueous solder flux, Alpha ® 709-F, manufactured by Alpha Metals, Inc., Jersey City, New Jersey and then is soldered with tin/lead (60/40) at 6 feet/minute (1.83 m/minute) using a wave solder unit manufactured by Hollis Engineering, Inc., Nashua, New Hampshire to form a solder circuit pattern. Excess solder flux residues are removed from the circuit pattern by washing with water. A second photopolymerizable layer of the same composition is laminated to the solder circuit pattern using the above described vacuum laminator. The photopolymerizable layer is imagewise exposed through a photographic positive image which is related to the underlying solder circuit pattern for 20 seconds to the DMVL-HP exposure source described above. The film supports are removed and copper powder is applied in a fluidized bed as described above. After excess copper powder is removed, the element is exposed for 4 minutes using the DMVL-HP exposure source described above through a photographic positive image which is opaque to the exposure radiation only in those areas corresponding to circular pad areas common to the two circuit patterns. The element samples are then developed in methyl chloroform as described in Example 1 to remove copper powder and photopolymerizable composition only in areas which are not exposed to the antinic radiation to allow underlying solder surface of the original printed circuit to be clearly visible through the holes produced.

The element is baked at 160°–165° C. for 60 seconds, brushed with solder flux as described above and then soldered using the wave solder unit described above to produce a two layer, soldered, printed circuit having good conductivity between both layers.

Through holes may be introduced in the common pad areas by drilling or punching the one layer circuit pattern, or the two layer pattern either before or after soldering. Similarly, electrical components may be introduced into through holes either before or after the second soldering step.

EXAMPLE 5

A layer of a photopolymerizable composition as described in Example 4 is laminated as described in that Example to a cleaned circuit board consisting of glass epoxy coated with copper. The photopolymerizable layer is exposed for 10 seconds through a photographic positive pattern to ultraviolet radiation from the DMVL-HP exposure source described in Example 1. The polyethylene terephthalate support is removed and copper powder as described in Example 1 is applied to the polymerized surface in a fluidized bed. After excess copper is removed, the metallized board is heated for 60 seconds in an oven at 180° C. The heated board is re-exposed as described above for 10 minutes through an image having the pad areas of the circuit opaque to the exposing radiation. The pad areas are developed as described in Example 1, and the developed board is passed once through an ultraviolet exposure source as described in Example 4. The circuit pattern is fluxed and soldered as described in Example 4. The circuit lines are conductive and are conductive between the copper layer and copper particle/solder lines where they are connected by developed holes filled with solder. The lines are not conductive to each other or to the copper layer where there is an insulation of photopolymer.

I claim:

1. A process for preparing a two layer printed circuit board having conductive interconnections which comprises:
   (a) applying to a substrate bearing an electrically conductive circuit pattern a layer of a photoadhesive composition;
   (b) exposing the layer to actinic radiation through a circuit image which is related to the underlying circuit pattern leaving an adherent circuit image having at least one segment thereof overlying at least one segment of the conductive circuit pattern;
   (c) applying finely divided metal, alloy or plating catalyst material to the adherent image areas;
   (d) exposing the metallized or catalyzed image to actinic radiation through an image of at least one overlying segment of the previous circuit patterns;
   (e) removing each overlying segment area with a solvent for the photoadhesive composition; and
   (f) plating, or soldering the metallized or catalyzed image to form an electrically conductive circuit pattern interconnected with the underlying circuit pattern.

2. A process according to claim 1 wherein between steps (e) and (f) the developed printed circuit board is heated to a temperature up to 180° C.

3. A process according to claim 1 wherein the finely divided material is a metal powder, 1.0 to 250 microns in average diameter.

4. A process according to claim 3 wherein the metal powder is copper or a copper alloy.

5. A process for preparing a multilayer printed circuit board having conductive interconnections which comprises preparing a two layer printed circuit according to claim 1 and then repeating steps (a) to (f) at least once using the newly plated circuit pattern in step (f) for the succeeding process step (a).

6. A process according to claim 1 wherein the layer of photoadhesive composition is applied in the form of a dry film.

7. A process for preparing a two layer printed circuit board having conductive interconnections from a supported adherent photopolymerizable layer consisting essentially of, in order,
   (a) laminating to a substrate bearing an electrically conductive circuit pattern the photopolymerizable layer;
   (b) exposing the photopolymerizable layer to actinic radiation through an image which is related to the underlying circuit pattern leaving an adherent circuit pattern on the photopolymerizable surface having at least one segment thereof overlying at least one segment of the conductive circuit pattern;
   (c) removing the support from the photopolymerizable layer;
   (d) applying finely divided copper particles 5 to 25 microns in average diameter to the adherent circuit pattern;
   (e) exposing the particulate copper circuit pattern to actinic radiation through an image of at least one overlying pad segment of the previous circuit pattern and which is opaque to actinic radiation in the areas corresponding to any overlying segment area to be interconnected;
   (f) removing the unexposed areas of the photopolymerizable layer with a solvent for the photopolymerizable layer; and
   (g) plating electrolessly or soldering the particulate copper circuit pattern to form an electrically conductive circuit pattern interconnected with the underlying electrically conductive printed circuit pattern.

8. A process according to claim 7 wherein between steps (f) and (g) the developed printed circuit board is heated at a temperature up to 180° C.

9. A process according to claim 1 wherein the photoadhesive composition is taken from the group consisting of photopolymerizable, photocrosslinkable and photodimerizable compositions.

10. A process according to claim 1 wherein the segments of the conductive circuit pattern to be interconnected are through-holes or plated through-holes.

11. A process according to claim 1 wherein the segments of the conductive circuit patterns to be interconnected are pad areas.

12. A process according to claim 1 wherein after step (e) additional finely divided metal or alloy is applied to the previously metallized image and said metallized image is plated by conjoining or burnishing.

13. A process according to claim 12 wherein the conjoined or burnished image is soldered.

14. A process according to claim 1 wherein the catalyzed image is plated.

* * * * *

UNITED STATES PATENT OFFICE
CERTIFICATE OF CORRECTION

PATENT NO. : 4,157,407
DATED : June 5, 1979
INVENTOR(S) : Robert William Peiffer It is certified that error appears in the above-identified patent and that said Letters Patent are hereby corrected as shown below:

Column 1, line 44 --,e.g.,-- was left out after the word "Nos."

Column 1, line 46 "multiplayered" should be --multilayered--.

Column 3, line 38 --a-- was left out after the word "be".

Column 4, line 67 "to" should be --in--.

Column 9, line 22 --also-- should be inserted after second "are".

Signed and Sealed this

Eighth Day of July 1980

[SEAL]

Attest:

SIDNEY A. DIAMOND

Attesting Officer

Commissioner of Patents and Trademarks